(12) United States Patent
Ashida

(10) Patent No.: US 7,333,574 B2
(45) Date of Patent: Feb. 19, 2008

(54) INTEGRATED CIRCUIT

(75) Inventor: Nobuyuki Ashida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 750 days.

(21) Appl. No.: 10/758,006

(22) Filed: Jan. 16, 2004

(65) Prior Publication Data

US 2004/0174942 A1 Sep. 9, 2004

(30) Foreign Application Priority Data

Mar. 5, 2003 (JP) ............................. 2003-058126

(51) Int. Cl.
*H04L 27/08* (2006.01)

(52) U.S. Cl. ..................................... 375/345

(58) Field of Classification Search ................ 375/345; 455/232.1, 234.1, 240.1; 330/129, 254
See application file for complete search history.

(56) References Cited

U.S. PATENT DOCUMENTS

| | | | |
|---|---|---|---|
| 5,029,182 A * | 7/1991 | Cai et al. ..................... | 375/136 |
| 5,142,695 A * | 8/1992 | Roberts et al. ............. | 455/437 |
| 5,267,272 A * | 11/1993 | Cai et al. ..................... | 375/345 |

FOREIGN PATENT DOCUMENTS

| | | | |
|---|---|---|---|
| JP | 2001068953 A | * | 3/2001 |
| JP | 2002-232498 A | | 8/2002 |

* cited by examiner

*Primary Examiner*—David C. Payne
*Assistant Examiner*—Leon Flores
(74) *Attorney, Agent, or Firm*—Birch, Stewart, Kolasch & Birch, LLP

(57) ABSTRACT

A front-end IC is so structured that an RF circuit section and a digital demodulating circuit section are integrated in one package therein. The RF circuit section has an RF circuit section and a base band variable gain amplifier. The digital demodulating circuit section has an amplification rate control circuit. The front-end IC is also provided with an AGC signal input switch for switching between (a) inputting an internal signal, via an AGC loop, into the RF circuit section in the RF circuit section and the base band variable gain amplifier, and (b) directly supplying a test-use AGC signal, by opening the AGC loop, into the RF circuit section in the RF circuit section and the base band variable gain amplifier. The internal signal is outputted from the digital demodulating circuit section. The AGC signal input switch is switched over in accordance with an AGC signal input switching signal TEST. With this arrangement, it is possible to provide an IC in which a test of amplification rate property of the variable gain amplifier included in the RF circuit, and other tests of the RF circuit can be performed easily.

4 Claims, 8 Drawing Sheets

INTEGRATED CIRCUIT

This Nonprovisional application claims priority under 35 U.S.C. § 119(a) on Patent Application No. 2003-58126 filed in Japan on Mar. 5, 2003, the entire contents of which are hereby incorporated by reference.

FIELD OF THE INVENTION

The present invention relates to an integrated circuit (IC) of a front-end type for receiving a high frequency signal, especially to an integrated circuit in which an RF circuit and a digital demodulation circuit are integrated in one package.

BACKGROUND OF THE INVENTION

Described below is a conventional front-end integrated circuit in which an RF (Radio Frequency) circuit and a digital demodulating circuit are integrated in one package.

A one-packaged front-end integrated circuit 100, which is generally used, is provided with an RF circuit section 110 and a digital demodulating circuit section 120 as shown in FIG. 8. The RF circuit section 110 and the digital demodulating circuit section 120 are in one package.

The RF circuit section 110 is provided with an RF variable gain amplifier 101, a modulating section 102, and a base band variable gain amplifier 103. The RF variable gain amplifier 101 amplifies a high frequency signal. The modulating section 102 performs quadrature modulation of the high frequency signal into an. I/Q base band signal. The base band variable gain amplifier 103 amplifies the I/Q (Inphase/Quadrature) base band signal.

Moreover, the digital demodulating circuit section 120 is provided with an analog-to-digital conversion circuit 121 for converting the I/Q base band signal into an I/Q digital signal. Thus, the digital demodulating circuit section 120 demodulates the I/Q digital signal.

In such front-end integrated circuit 100 in which the RF circuit section 110 and the digital demodulating circuit section 120 are integrated in one package, the RF circuit section 110 and the digital demodulating circuit section 120 are internally connected via base band signal (BBS) lines 131 and an amplification ratio control signal line 132 (hereinafter, an amplification ratio control signal is referred to as an automatic gain control (AGC) signal).

In normal operation, a feedback loop is constituted so that an input signal level of the digital demodulating circuit section 120 is kept constant (an input signal to be inputted into the digital demodulating circuit section 120 has a certain level constantly). In short, a base band signal (BBS), which is an I/Q base band analog output from the RF circuit section 110, is supplied to the digital demodulating circuit section 120. Then, analog-to-digital conversion of the base band signal is performed. Here, an amplification ratio control circuit 122 of the digital demodulating circuit section 120 is constituted of a digital circuit. The amplification ratio control circuit 122 detects a level of a base band output that has been digitalized. Then, in accordance with the level thus detected, the amplification ratio control circuit 122 outputs a digital AGC signal so that the input signal to be inputted into the digital demodulating circuit section 120 has a certain level constantly. The digital AGC signal is converted from digital to analog. Then, the AGC signal thus converted is supplied to an AGC input terminal of the RF circuit section 110.

As to the RF circuit section 110, the following properties may be tested, for example, Gain property, such as maximum gain, minimum gain, a maximum variable range of gain, and the like, Level differences of I/Q base band signal (BBS), Phase differences (quadrature property) of I/Q base band signal (BBS), and Phase noise property.

An example of a conventional testing method as to the RF circuit section 110 of the one-packaged front-end integrating circuit 100 is a test disclosed in Japanese Publication of Unexamined Patent Application "Tokukai No. 2002-232498 (published on Aug. 16, 2002). In this testing method, a test is carried out while an automatic gain control loop (hereinafter, referred to as an "AGC loop") is closed.

However, in the conventional integrating circuit, a terminal from which an output signal of the digital demodulating circuit section 120 is outputted is directly connected to the AGC input terminal that is connected to the RF variable gain amplifier 101 located inside the RF circuit section 110, thereby forming the AGC loop. It is a problem that it is impossible to test, in a short time, the amplification ratio property and the like of the RF variable gain amplifier 101 included in the RF circuit section 110.

That is, for the test to find values of the maximum gain and the minimum gain, or the maximum variable range of gain from the values of the maximum gain and the minimum gain, it is necessary to sweep the level of the input signal and evaluate an AGC signal level after convergence of the AGC loop. Alternatively, it is necessary to monitor the BER before error correction in order to find a level at which a bit error ratio (BER) becomes less than a certain value. Such test needs a long time.

Similarly, as for tests that do not depend on the output level, such as a test of phase noise by using a voltage controlled oscillator (VCO), a test of I/Q phase difference, and the like, it is necessary to program the tests such that a waiting time for waiting the convergence of the AGC signal is included. Thus, a test time of such tests is long in vein.

Moreover, even if the control is possible, the base band signal is not outputted to outside of the integrated circuit, lest the BER be reduced. This constrains the property tests (tests on the properties) of the RF section only. Especially, monitoring a BER property of a reception signal is the only way to evaluate the properties, such as the I/Q phase difference and phase noise, and needs a long time.

Furthermore, the test of the RF circuit section 110 requires that the digital demodulation circuit section 120 be provided with means for testing the RF circuit section 110. This leads to inaccuracy of the test and scale up a size of the circuit.

Even if an output terminal is provided, a driving circuit should be provided outside the integrated circuit in order to connect the output terminal with a measuring apparatus. Thus, when a test is carried out by using an I/Q signal, a result of the test is under influence of relativity of the driving circuit thus externally provided. Thus, a circuit using a discrete circuit need be designed with much care.

SUMMARY OF THE INVENTION

An object of the present invention is to provide an integrated circuit in which a test on amplification rate property of a variable gain amplifier of an RF circuit and other tests regarding the RF circuit can be performed easily.

In order to attain the object, an integrated circuit of the present invention is an integrated circuit of a front-end type for receiving a high frequency signal, including: an RF circuit including a variable gain amplifier; a digital demodulating circuit including an amplification rate control circuit;

a switching section for switching between (a) inputting an internal signal, as an amplification rate control signal, into the variable gain amplifier via an automatic gain control loop, the internal signal being outputted from the digital demodulating circuit and (b) directly inputting a fixed value signal, as an amplification rate control signal, into the variable gain amplifier by opening the automatic gain control loop, the RF circuit and the digital demodulating circuit being integrated in one package, and the switching section being switched over in accordance with a switching control signal.

According to the above invention, the switching section switches between the internal signal and the fixed value signal, as the amplification rate control signal to be inputted to the variable gain amplifier of the RF circuit, the internal signal outputted from the digital demodulating circuit and supplied via an automatic gain control loop, and the fixed value signal directly supplied by opening the automatic gain control loop.

Therefore, it is possible to carry out the tests of the RF circuit by using such an amplification rate control signal that has a predetermined fixed value. Thus, it is possible to test the amplification property and the like easily and directly. Moreover, it is unnecessary to have a waiting time for waiting convergence of the automatic gain control loop, whereby the test can be carried out in a short time. Thus, it is possible to prevent cost increase in the test.

Moreover, because the switching section is switched over in accordance with the switching control signal, it is possible to operate the switching section easily.

As a result, it is possible to provide an integrated circuit in which the test on amplification rate property of the variable gain amplifier of the RF circuit and other tests regarding the RF circuit can be easily tested.

For a fuller understanding of the nature and advantages of the invention, reference should be made to the ensuing detailed description taken in conjunction with the accompanying drawings.

DESCRIPTION OF THE EMBODIMENTS

First Embodiment

Described below is an embodiment of the present invention, referring to FIGS. 1 to 5.

Figure 1:
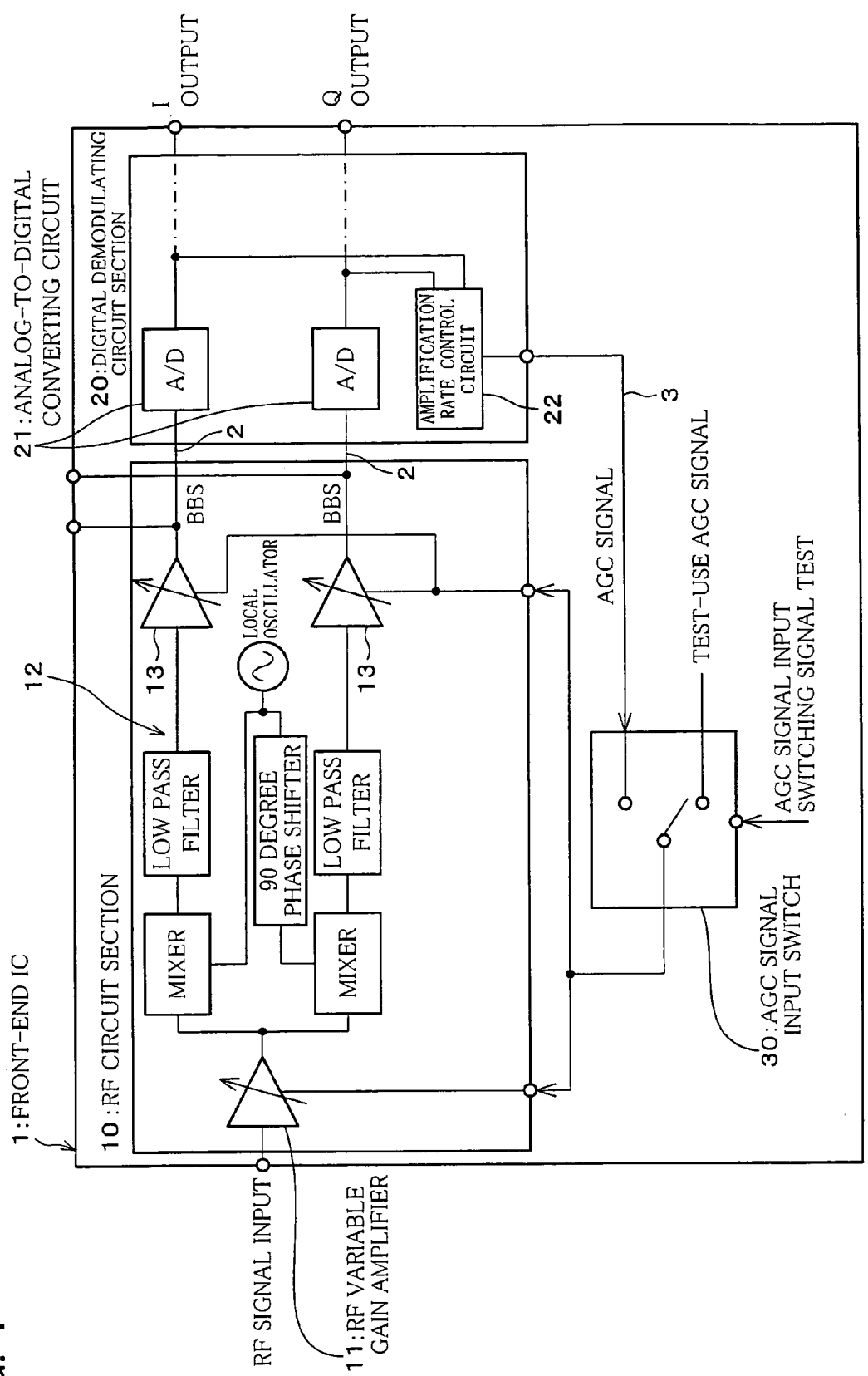
FIG. 1 is a block diagram illustrating an embodiment of a front-end IC of the present invention.

As shown in FIG. 1, a front-end IC 1, which is an IC of the present embodiment, is provided with an RF (Radio Frequency) circuit section 10 and a digital demodulating circuit section 20. The RF circuit section 10 functions as an RF circuit. The digital demodulating circuit section 20 functions as a digital demodulating circuit, the RF circuit section 10 and the digital demodulating circuit are integrated in one package in the front-end IC 1.

The RF circuit section 10 is provided with an RF variable gain amplifier 11, a modulating section 12, and base band variable gain amplifiers 13. The RF variable gain amplifier 11 is a variable gain amplifier for amplifying a high-frequency signal. The modulating section 12 performs quadrature modulation of the high frequency signal into an I/Q base band signal. The base band variable gain amplifiers 13 are variable gain amplifiers for amplifying the I/Q base band signal.

Moreover, a digital demodulating circuit section 20 is provided with an analog-to-digital converting circuit 21 and an amplification rate control circuit 22. The analog-to-digital converting circuit 21 converts the I/Q base band signal into an I/Q digital signal. The digital demodulating circuit section 20 thus arranged demodulates the I/Q digital signal that is supplied thereto from the RF circuit section 10.

In the front-end IC 1 in which the RF circuit section and the digital demodulating circuit section 20 are integrated in one package, the RF circuit section 10 and the digital demodulating circuit section 20 are connected with one another via base band signal (BBS) lines 2.

Meanwhile, in the present embodiment, an amplification rate signal line 3 (hereinafter, the amplification rate signal is referred to as an AGC signal) is extended from the amplification rate control circuit 22 to the RF variable gain amplifier 11 and the base band variable gain amplifiers 13 via an AGC signal input switch 30.

In short, a feed back loop is constituted so that an input signal level of the digital demodulating circuit section 20 (a level of a signal inputted into the digital demodulating circuit section 20) is kept at a certain level by using the amplification rate control circuit 22.

In the front-end IC 1, the RF circuit section 10 outputs a base band signal (BBS), which is an I/Q base band analog output. The BBS is supplied to the digital demodulating circuit section 20 from the RF circuit section 10. In the digital demodulating circuit section 20, the BBS is converted from analog to digital (digitalized). Here, the amplification rate control circuit 22 of the digital demodulating circuit section 20 is constituted of a digital circuit. The amplification rate control circuit 22 detects a level of the base band output that has been thus digitalized. In accordance with the level thus detected, the amplification rate control circuit 22 outputs a digital AGC (Automatic Gain Control) signal so as to keep the input signal level of the digital demodulating circuit section 20. Then, the digital AGC signal is converted from digital to analog (analogized). The AGC signal thus analogized is supplied to an AGC input terminal of the RF circuit section 10.

As the RF circuit section 10, the following properties need be tested, for example, Gain property, such as maximum gain, minimum gain, a maximum variable range of gain, and the like, Level differences of I/Q base band signal (BBS), Phase differences (quadrature property) of I/Q base band signal (BBS), and Phase noise property.

However, in the conventional IC, a terminal from which an output signal of the digital demodulating circuit section is outputted is directly connected to the AGC input terminal that is connected to the RF variable gain amplifier located inside the RF circuit section, thereby forming the AGC loop. Because of this, the conventional IC has such a problem that the test on the amplification ratio property and the like of the RF variable gain amplifier located in the RF circuit section cannot be carried out in a short time.

Hence, in the present embodiment, the AGC signal input switch 30 functions as a switching means so as to switch between use of the AGC signal and use of a test-use AGC signal (an AGC signal for test use) in accordance with an AGC signal input switching signal TEST, which is a switching control signal. The AGC signal is an internal signal that is outputted from the digital demodulating circuit section 20. When the AGC signal is used, the AGC signal is supplied, as an AGC input, to the RF variable gain amplifier 11 in the RF circuit section 10 via the AGC loop. The test-use AGC signal is a signal having a fixed value. When the test-use AGC signal is used, the test-use AGC signal is supplied directly to the RF variable gain amplifier 11 in the RF circuit section 10, by opening the AGC loop. (In other words, the AGC signal input switch 30 switches between (a) inputting the AGC signal, as the AGC input, to the RF variable gain amplifier 11 via the AGC loop, and (b) directly inputting the test-use AGC signal having the fixed value, as the AGC input, into the RF variable gain amplifier 11 by opening the AGC loop.)

In short, in a normal operation, the I/Q base band analog output from the RF circuit section 10, that is, the BBS outputted from the RF circuit section 10, is converted from analog to digital. Further, the level of the digitalized BBS is detected. Then, the AGC signal that corresponds to the detected level, is converted from digital to analog (analogized). The analogized AGC signal is supplied to the AGC input of the RF circuit section 10.

On the other hand, when an RF properties of the front-end IC 1 is to be tested, it is possible to supply the AGS signal directly to the RF circuit section 10 in accordance with the AGC signal input switching signal TEST. With this arrangement, the test on the maximum gain and the minimum gain of the RF circuit section 10 can be carried out without sweeping the level of the input signal and evaluating the BER property and the AGC signal after the AGC convergence. The test on the maximum gain and the minimum gain can be carried out simply by evaluating a level of output. Thus, sweeping of the input signal is unnecessary and the test can be carried out in a short time.

Moreover, it is not necessary to have a waiting time for waiting convergence of the AGC loop. In this regards, the test can be carried out in a short time.

Incidentally, various arrangements may be adopted to supply the AGC signal input switching signal TEST to the AGC signal input switch 30.

Figure 2:
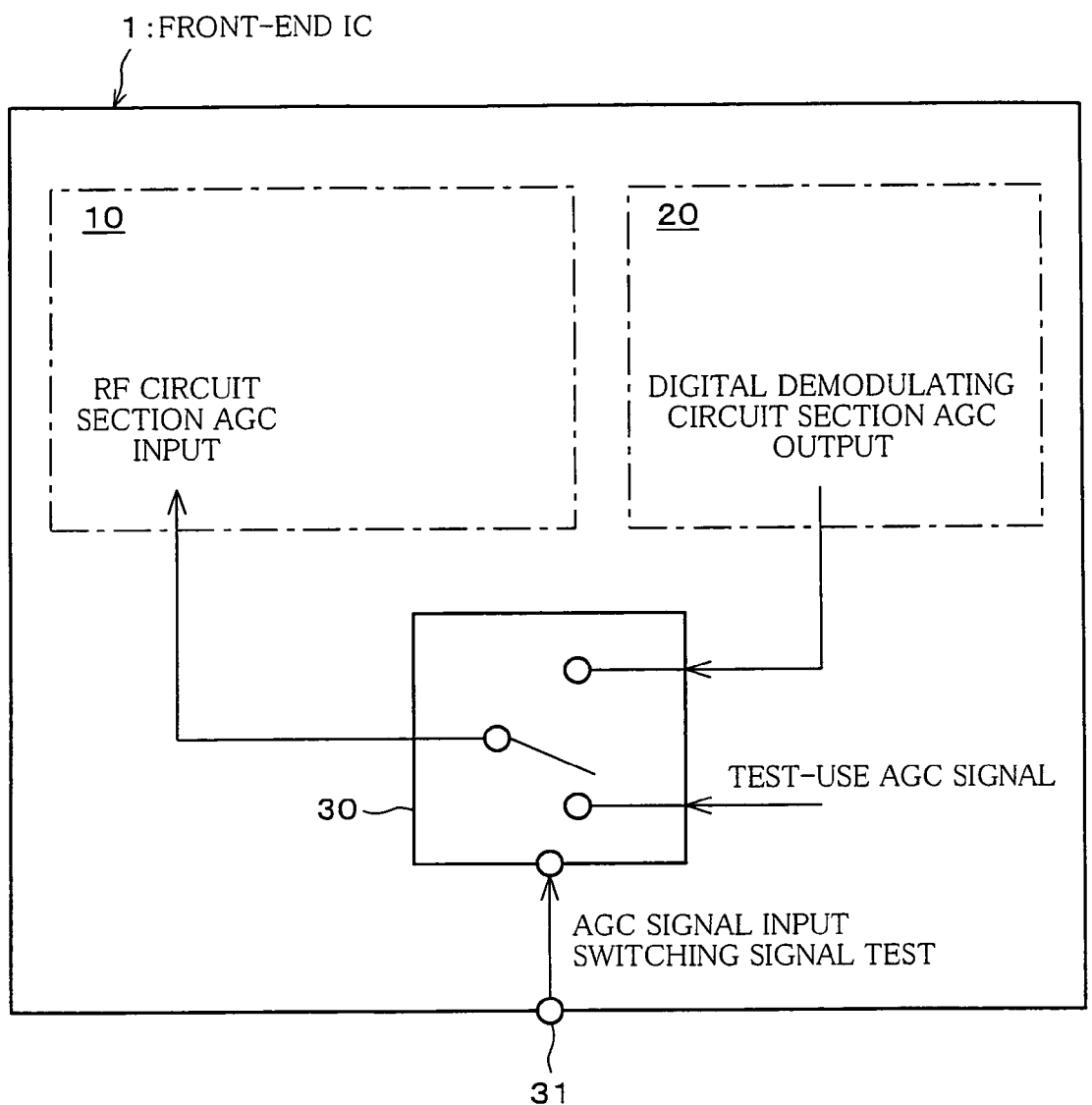
FIG. 2 is a block diagram illustrating a front-end IC in which an AGC signal input switching signal is supplied from outside, the AGC signal input switching signal being for an AGC signal input switch.

For example, as shown in FIG. 2, it is possible to arrange such that the AGC signal input switching signal TEST for use in the test of the RF circuit section 10 is supplied from outside via a test-use connection terminal 31 (a connection terminal for test use) of the front-end IC 1.

With this arrangement, it is unnecessary to have a circuit for generating, in the front-end IC 1, a test-use switching signal (switching signal for test use). Thus, it is possible to directly the front-end IC 1 to the front-end IC 1 without upsizing the front-end IC 1.

Figure 3:
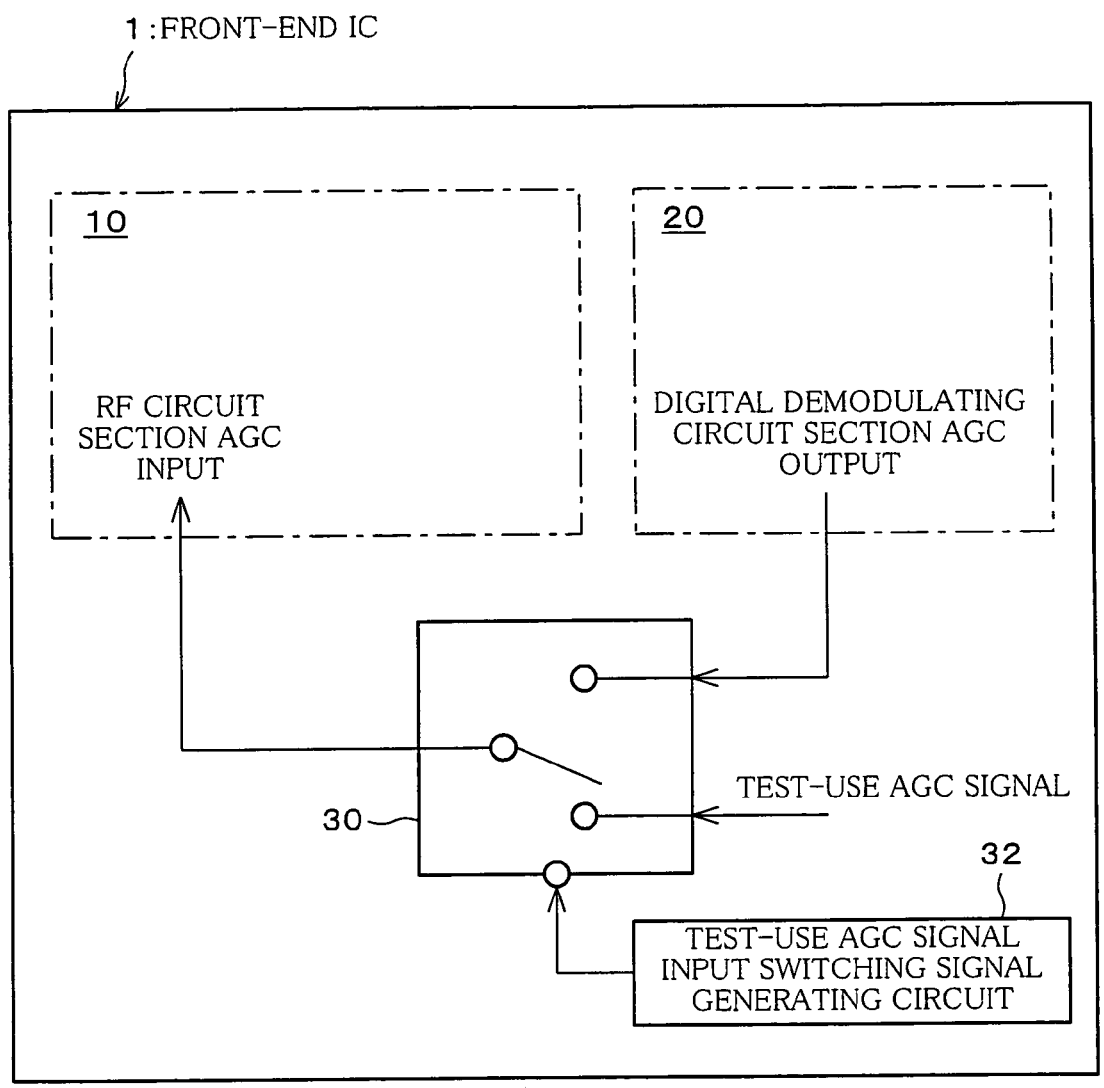
FIG. 3 is a block diagram illustrating a front-end IC in which an AGC signal input switching signal is generated by a test-use switching signal generating circuit, the AGC signal input switching signal being for an AGC signal input switch.

Moreover, as another arrangement, it is possible to arranged as shown in FIG. 3, for example. In the arrangement shown in FIG. 3, the AGC signal input switching signal TEST is generated by a test-use switching signal generating circuit 32 located in the front-end IC 1. The test-use switching signal generating circuit 32 is a switching control signal generating means.

As the test-use switching signal generating circuit 32 in the front-end IC 1, it is preferable to use a register of a serial bus interface type, for example. The register is for use in setting PLL of a local oscillator.

With this arrangement, it is possible to directly supply the test-use AGC signal without providing the test-use connection terminal 31 additionally.

Meanwhile, various arrangements may be adopted to supply the test-use AGC signal.

Figure 4:
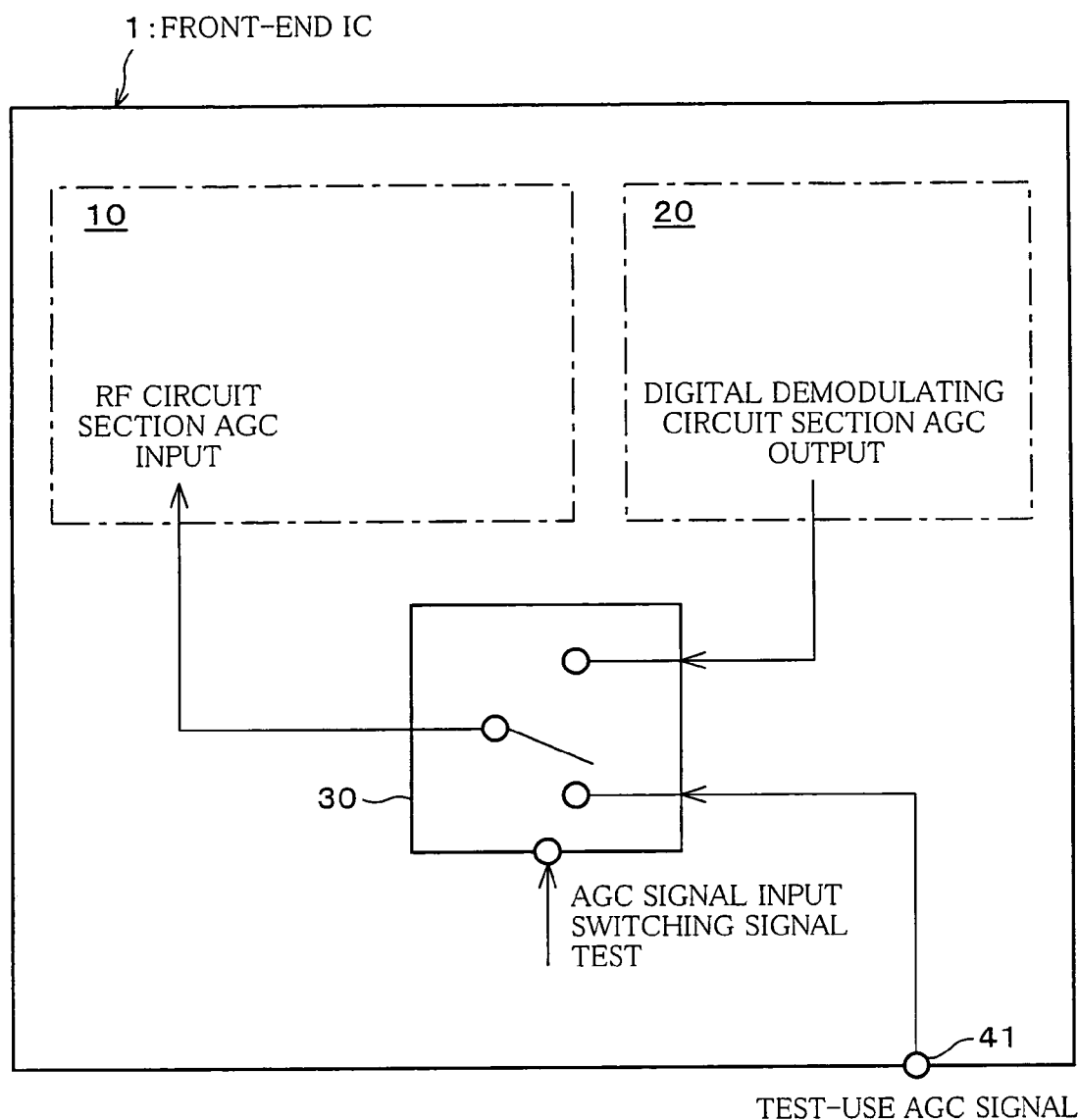
FIG. 4 is a block diagram illustrating a front-end IC in which a test-use AGC signal is supplied from outside, the test-use AGC signal being for an AGC signal input switch.

For example, it is possible to arrange such that, as shown in FIG. 4, the test-use AGC signal for use in the test of the RF circuit section 10 is supplied from outside of the front-end IC 1 via a test-use AGC signal input terminal 41.

With this arrangement, it is unnecessary to have a circuit for generating the test-use GCS signal. Thus, it is possible to easily supply the test-use AGC signal directly without scaling up the front-end IC 1.

Figure 5:
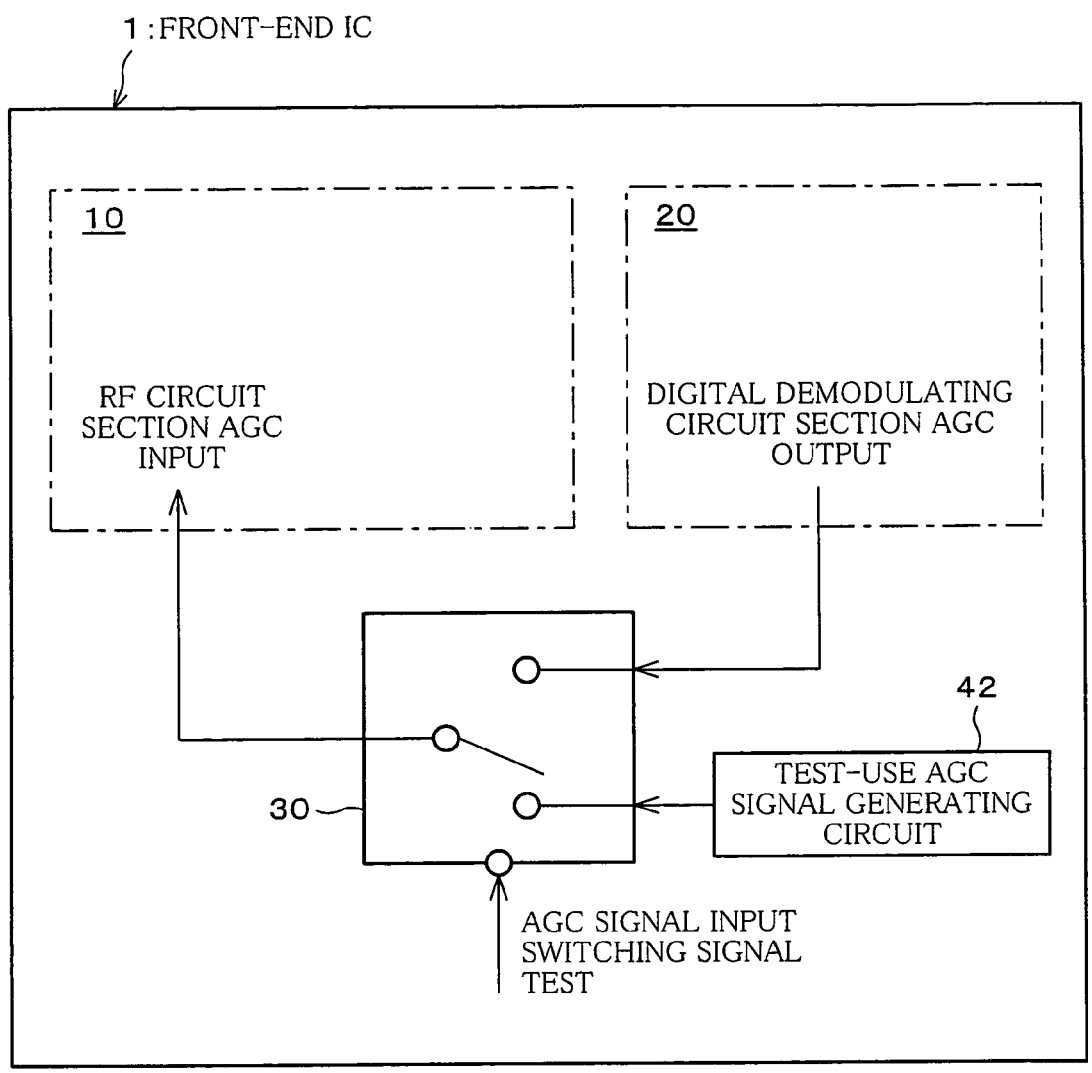
FIG. 5 is a block diagram illustrating a front-end IC in which a test-use AGC signal is generated by a test-use AGC signal generating circuit, the test-use AGC signal being for the AGC signal input switch.

Moreover, how to prepare the test-use AGC signal is not limited to this. For example, it is possible to arrange such that, as shown in FIG. 5, the test-use AGC signal for use in the test of the RF circuit section 10 is generated by a test-use AGC signal generating circuit 42 located in the front-end IC 1. The test-use AGC signal generating circuit 42 is a test-use fixed value signal generating means. As the test-use AGC signal generating circuit 42 in the front-end IC 1, it is preferable to use the register of the serial bus interface type, for example. The register is for use in setting PLL of a local oscillator.

With this arrangement, it is possible to supply the test-use AGC signal directly, without providing the test-use AGC signal input terminal 41, additionally.

As described above, the front-end IC 1 of the present embodiment is capable of switching between, by using the AGC signal input switch 30, the use of the AGC signal and the use of the test-use AGC signal as the AGC signal to be inputted to the RF variable gain amplifier 11 and the base band variable gain amplifiers 13 in the RF circuit section 10. The AGC signal is an internal signal outputted from the digital demodulating circuit section 20 and supplied via the AGC loop to the RF variable gain amplifier 11 and the base band variable gain amplifiers 13 in the RF circuit section 10. The test-use AGC signal is directly supplied to the RF variable gain amplifier 11 and the base band variable gain amplifiers 13 in the RF circuit section 10. When the test-use AGC signal is supplied, the AGC loop is opened. (In other words, the AGC signal input switch 30 switches between (a) inputting the AGC signal, as the AGC signal, into the RF variable gain amplifier 11 and the base band variable gain amplifiers 13 via the AGC loop, and (b) directly supplying the test-use AGC signal, as the AGC signal, to the RF variable gain amplifier 11 and the base band variable gain amplifiers 13 by opening the AGC loop.)

Therefore, it is possible to use the AGC signal having a predetermined fixed value, for testing the RF circuit section 10. Thus, it is possible to directly and easily test the amplification rate property and the like. Moreover, it is unnecessary to have a waiting time for waiting for the convergence of the AGC loop, thus allowing to carry out the test in a short time. Thus, it is possible to reduce a cost of testing.

Moreover, the AGC signal input switch 30 is switched over in accordance with the AGC signal input switching signal TEST. Thus, the AGC signal input switch 30 is operated with ease.

As a result, it is possible to provide the front-end IC 1 in which the RF circuit section 10 can be easily tested in terms of the amplification rate properties and the like properties of the RF variable gain amplifier 11 and the base band variable gain amplifiers 13 in the RF circuit section 10.

Moreover, in the front-end IC 1 of the present embodiment, the AGC signal input switching signal TEST for switching over the AGC signal input switch 30 is supplied from outside. Thus, it is not necessary to provide the front-end IC 1 internally with a circuit for testing. Thus, it is unnecessary to scale up the front-end IC 1, and it is possible to carry out the test in a short testing time while attaining a low manufacturing cost. Especially, this arrangement is effective in a case where there is a large restriction in terms of a chip area.

Moreover, in the front-end IC 1 of the present embodiment, the AGC signal input switching signal TEST for switching over the AGC signal input switch 30 is supplied from the test-use switching signal generating circuit 32.

Therefore, it is unnecessary to provide an inspection-use pin for external connection. Thus, it is possible to carry out the test in a short time while attaining a low manufacturing cost. This arrangement is especially effective in case where there is a large restriction in how many number of the inspection-use pin can be provided.

Moreover, the front-end IC 1 of the present embodiment is so arranged that, by opening the AGC loop, it is possible to supply a test-use control voltage from outside, and to use the test-use control voltage as the test-use AGC signal that is to be inputted into the RF variable gain amplifier 11 and the base band variable gain amplifiers 13 in the RF circuit section 10.

Because the test-use AGC signal is inputted from outside, it is unnecessary to provide the front-end IC circuit internally with a circuit for testing. Thus, the front-end IC 1 is not scaled up. Therefore, it is possible to carry out the test in a short time while attaining a low manufacturing cost. Especially, this arrangement is effective in a case where there is a large restriction in terms of a chip area.

Moreover, in the front-end IC 1 of the present embodiment, it may be so arranged that the test-use AGC signal that is to be directly supplied is generated by the test-use AGC signal generating circuit 42 provided in the front-end IC 1.

With this arrangement, it is unnecessary to provide an inspection-use pin for external connection. Thus, it is possible to carry out the test in a short time, while attaining a low manufacturing cost. This arrangement is especially effective in case where there is a large restriction in how many number of the inspection-use pin can be provided.

Second Embodiment

Described below is another embodiment of the present invention, referring to FIG. 6. Note that the present embodiment is similar to the first embodiment, except the following arrangement specifically discussed below. Thus, sections having the same functions as those illustrated in figures of the first embodiment are labeled in the same manner and their explanation is omitted here.

In the first embodiment, the AGC signal input switch 30 as switching means is provided in that part of the front-end IC 1 in which the RF circuit section 10 and the digital demodulating circuit section 20 are not located.

Figure 6:
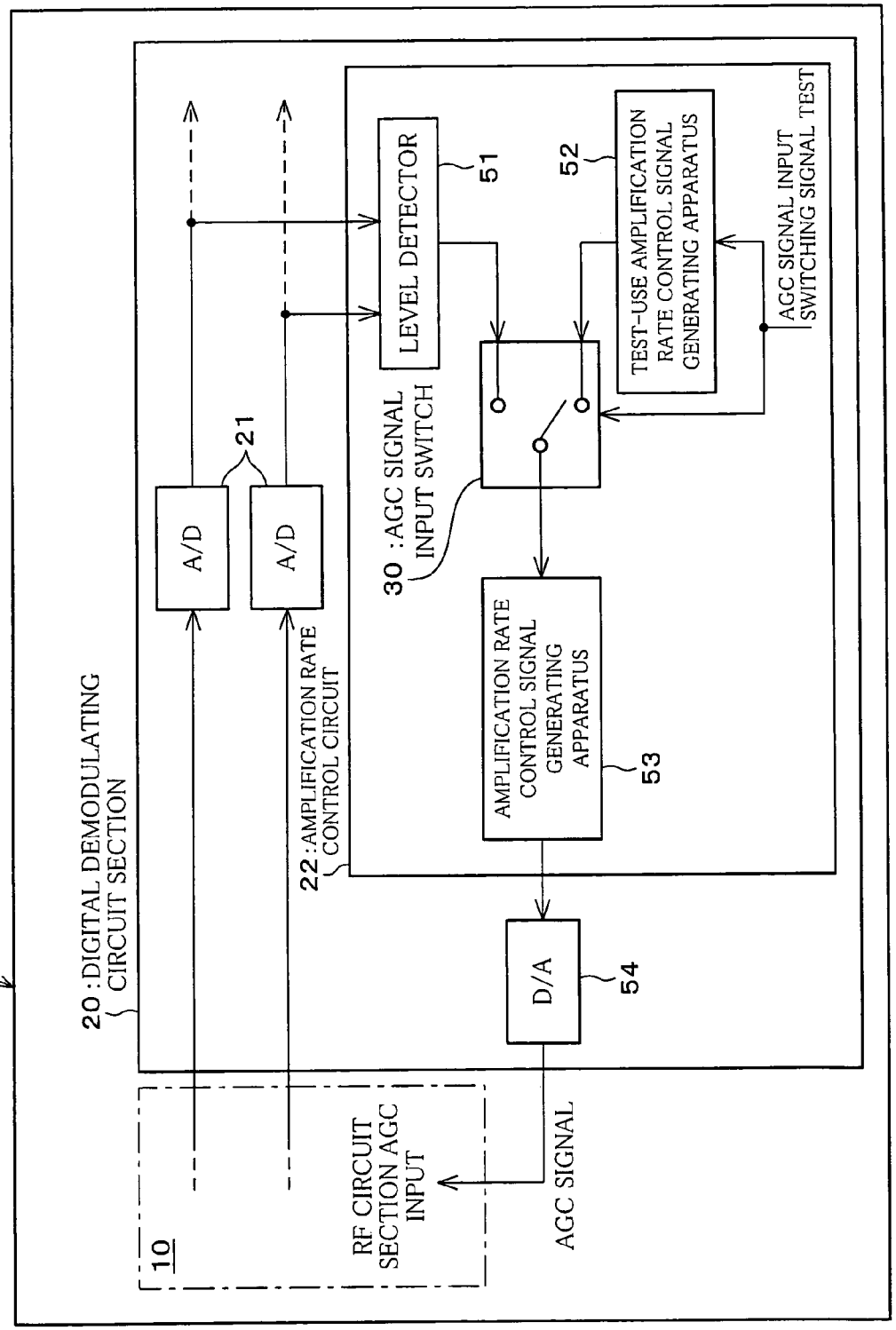
FIG. 6 is a block diagram illustrating a front-end IC in which a test-use AGC signal is generated by a test-use AGC signal generating circuit, the test-use AGC signal being for the AGC signal input switch.

However, an AGC signal input switch 30 of a front-end IC 1 of the present embodiment is provided in an amplification rate control circuit 22 of a digital demodulating circuit section 20, as shown in FIG. 6.

Specifically, the amplification rate control circuit 22 of the digital demodulating circuit section 20 of the front-end IC 1 of the present embodiment is provided with a level detector 51, the AGC signal input switch 30, a test-use amplification rate control signal generating apparatus 52, and an amplification rate control signal generating apparatus 53. The test-use amplification rate control signal generating apparatus 52 is test-use amplification rate control signal generating means.

Output of the amplification rate control signal generating apparatus 52 of the digital demodulating circuit section 20 is supplied to an RF variable gain amplifier 11 and base band variable gain amplifiers 13 of the RF circuit section 10, via a digital-to-analog converting circuit 54.

In the front-end IC 1, output of an analog-to-digital converting circuits 21 of the digital demodulating circuit section 20 is supplied to the amplification rate control signal generating apparatus 53, via the level detector 51 and the AGC signal input switch 30. Further, output of the amplification rate control signal generating apparatus 53 is fed back to the RF circuit section 10. The output of the amplification rate control signal generating apparatus 53 is an AGC signal.

On the other hand, in the present embodiment, a signal outputted from the test-use amplification rate control signal generating apparatus 52 is supplied to the AGC signal input switch 30. The AGC signal input switch switches between (a) the signal outputted from the test-use amplification rate control signal generating apparatus 52, and (b) a signal outputted from the level detector 51. Via the AGC signal input switch 30, one of (a) the signal outputted from the test-use amplification rate control signal generating apparatus 52, and (b) the signal outputted from the level detector 51 is outputted to the amplification rate control signal generating apparatus 53 in a switching over manner.

In the present embodiment, moreover, the AGC signal input switching signal TEST is supplied to both of the AGC signal input switch 30 and the test-use amplification rate control signal generating apparatus 52. When the AGC signal input switching signal TEST is supplied to both of the AGC signal input switch 30 and the test-use amplification rate control signal generating apparatus 52, a test-use amplification rate control signal is generated by the test-use amplification rate control signal generating apparatus 52, and the AGC signal input switch 30 switches over to allow the test-use amplification rate control signal to pass therethrough.

As a result, in a normal operation, the amplification rate control circuit 22 outputs a digital AGC signal in accordance with a detected level of a base band output. On the other hand, when an RF property is to be tested, the amplification rate control circuit 22 outputs a digital AGC signal having a fixed value that is suitable for the test. Because the amplification rate control circuit 22 is constituted of a digital circuit, it is possible to generate the test-use control signal easily.

With this arrangement, it is possible to directly supply the AGC signal without providing an inspection-use pin.

As described above, in the front-end IC 1 of the present embodiment, the digital demodulating circuit section 20 is provided with the amplification rate control circuit 22 in the AGC loop. The amplification rate control circuit 22 is provided with the amplification rate control signal generating apparatus 53 for generating the AGC signal that is to be supplied to the RF variable gain amplifier 11 and the base band variable gain amplifiers 13 in the RF circuit section 10. Moreover, the AGC signal input switch 30 is provided preceding to the amplification rate control signal generating apparatus 53 of the amplification rate control circuit 22.

With this arrangement, a control signal outputted from the amplification rate control circuit 22 of the digital demodulating circuit section 20 can be used as the amplification rate control signal that is to be inputted to the RF variable gain amplifier 11 and the base band variable gain amplifiers 13. That is, it is possible to use the control signal instead of the amplification rate control signal directly that is to be supplied to the RF variable gain amplifier 11 and the base band variable gain amplifiers 13 by opening the AGC loop.

Therefore, the present embodiment is especially effective in an front-end IC 1 in which the RF circuit section 10 and the digital demodulating circuit section 20 are within one chip.

Moreover, the front-end IC 1 of the present embodiment is so arranged that the test-use amplification rate control signal generating apparatus 52 is provided in the amplification rate control circuit 22, the test-use amplification rate control signal generating apparatus 52 outputting the test-use amplification rate control signal (control signal) to the amplification rate control signal generating apparatus 53 via the AGC signal input switch 30. The test-use amplification rate control signal corresponds to the test-use AGC signal that is directly supplied by opening the AGC loop.

With this arrangement, it is unnecessary to provide an inspection-use pin for external connection. Thus, the present embodiment enables to test in short time without increasing the manufacturing cost. This arrangement is especially effective in a case where there is a large restriction in how many inspection-use pin can be provided.

Third Embodiment

Described below is still another embodiment of the present invention, referring to FIG. 7. Note that the present embodiment is similar to the first and second embodiments, except the following arrangement specifically discussed below. Thus, sections having the same functions as those illustrated in figures of the first and second embodiments are labeled in the same manner and their explanation is omitted here.

Figure 7:
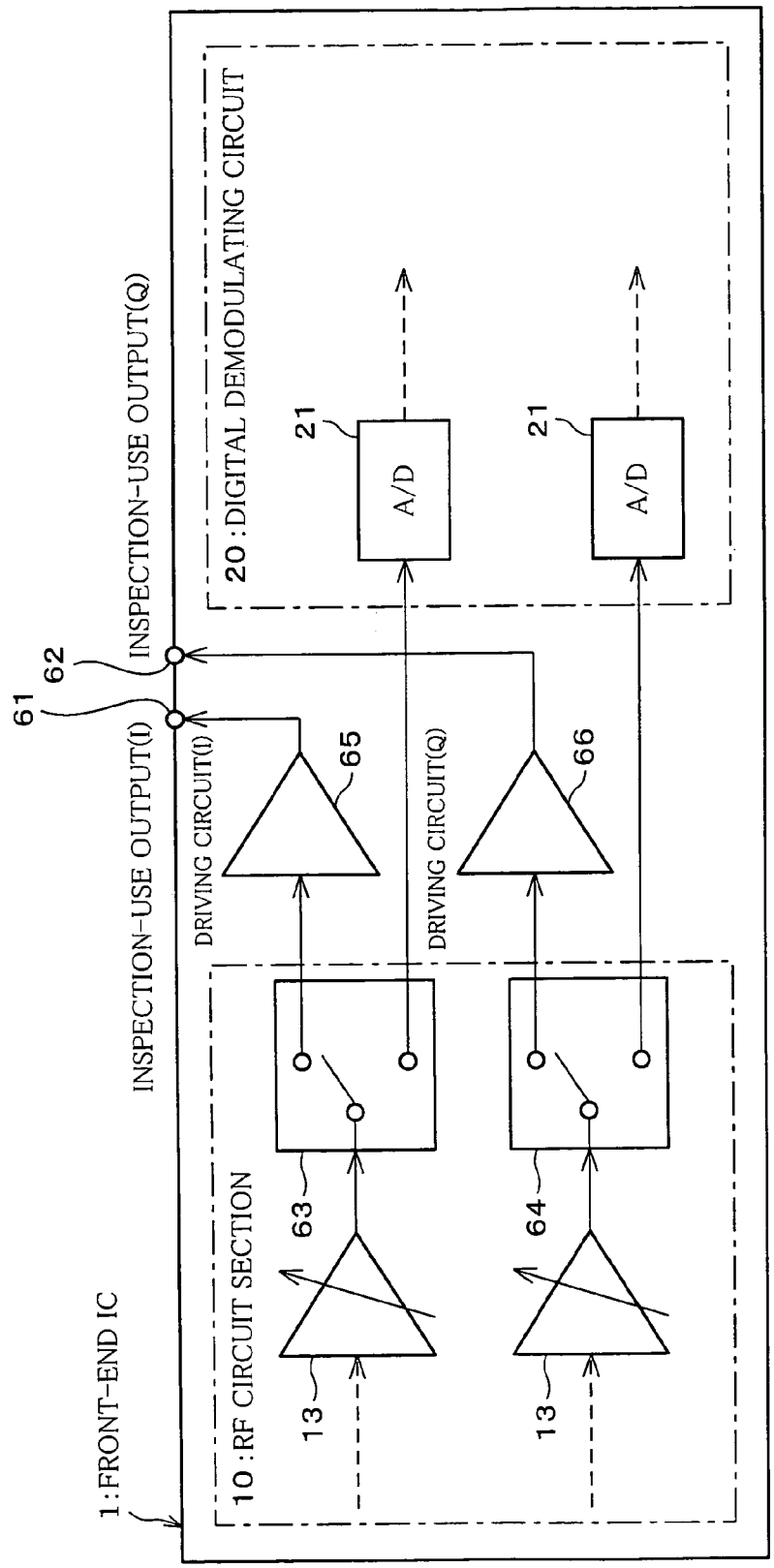
FIG. 7 is a block diagram illustrating a front-end IC including a switch circuit for switching between, in accordance with an output draw-out switching control signal, (a) inputting a base band analog output directly into a digital demodulating circuit and (b) outing the base band analog output to outside via an inspection-use output terminal, the base band analog output being outputted from an RF circuit section.
Figure 8:
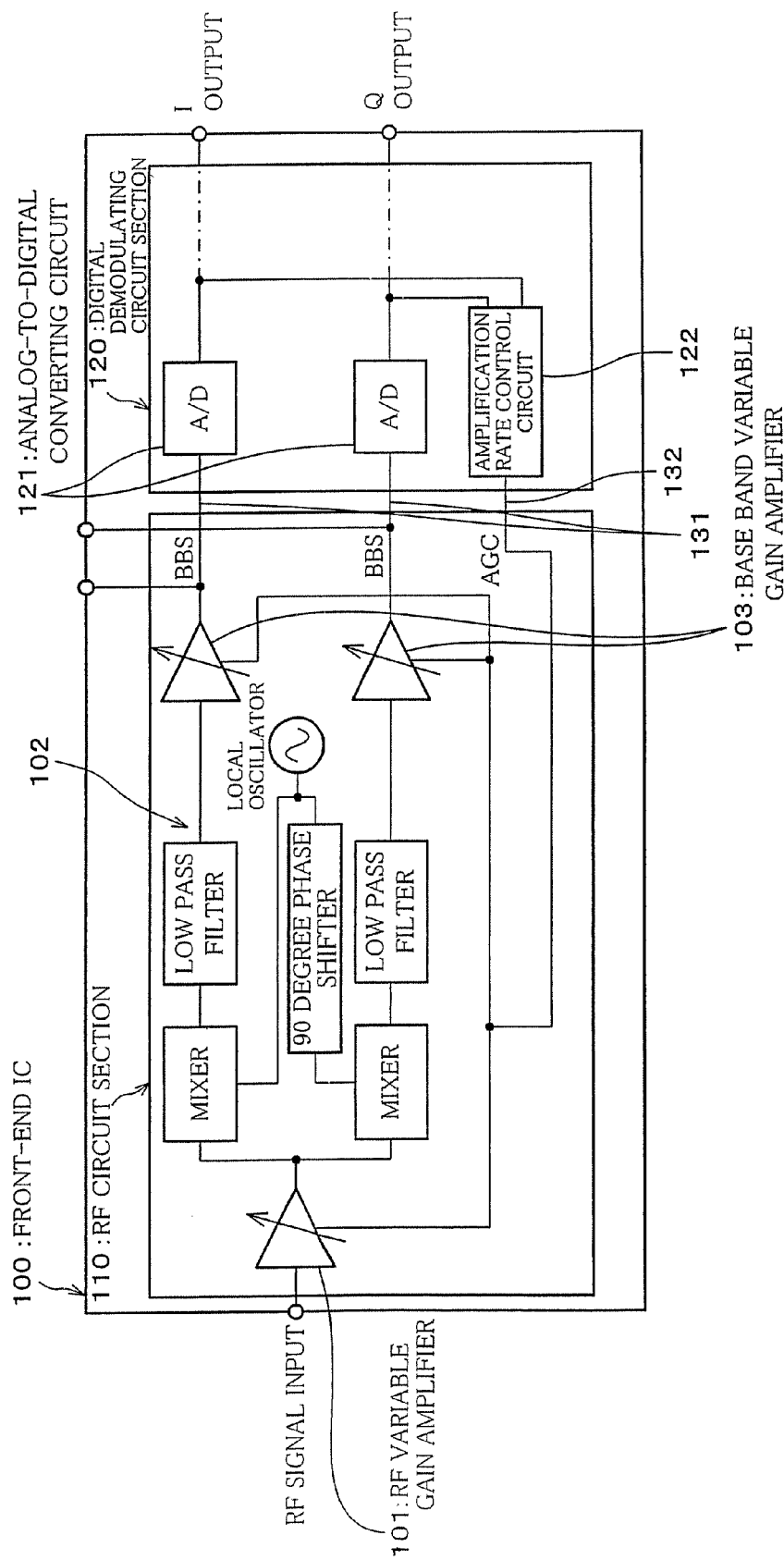
FIG. 8 is a block diagram illustrating a conventional front-end IC.

In addition to the arrangements of the first and second embodiments, a front-end IC 1 of the present embodiment is arranged such that, as shown in FIG. 7, a base band I/Q analog output can be outputted (drawn out) to outside of the front-end IC 1 via inspection-use output pins 61 and 62 when testing the RF circuit section 10. The inspection-use output pins 61 and 62 are inspection-use output terminals.

Specifically, the present embodiment is so arranged that output of the base band variable gain amplifiers 13 of the RF circuit section 10 is supplied to the analog-to-digital converting circuit 21 of the digital demodulating circuit section 20 via BBS switches 63 and 64 that are switch circuits.

The other output of the BBS switches 63 and 64 are outputted to the inspection-use output pins 61 and 62 via driving circuits 65 and 66.

With this arrangement, it is possible to directly test the RF circuit section 10 in terms of properties such as amplification property, phase noise, and I/Q phase differences, without providing the digital demodulating circuit section 20 with means for testing the RF circuit section 10.

With this arrangement, it is possible to test the RF circuit section accurately without scaling up the front-end IC 1.

Moreover, the present embodiment is so arranged that the driving circuits 65 and 66 are provided for use in outputting the base band I/Q analog output.

With this arrangement, it is possible to supply a measurement apparatus, which has a low input impedance, with such a signal that has a signal level high enough for the measurement apparatus to perform measurement highly accurately.

Moreover, the present embodiment is so arranged that the driving circuits are provided in the front-end IC 1. With this arrangement, the pair of the driving circuits 65 and 66 located in the front-end IC 1 have a high relativity. Because of this, it is possible to test the level difference and the phase difference of the I/Q signal accurately.

As described above, the front-end IC 1 of the present embodiment is so arranged that the BBS switches 63 and 64 are controlled in accordance with an output draw-out switching control signal (not shown) so as to switch between (a) directly inputting, to the digital demodulating circuit section 20, the base band analog output that is outputted from the RF circuit sections 10 is supplied, and (b) outputting the base band analog output to the outside via the inspection-use output pins 61 and 62.

With this arrangement, it is possible to directly draw out (outputting) the output of the RF circuit section 10. Thus, it is possible to carry out the test on the RF circuit section 10 without providing the digital demodulating circuit section 20 with means for testing the RF circuit.

Therefore, it is possible to test the RF circuit section in a much shorter time accurately, without scaling up the front-end IC 1. Thus, it is possible to prevent cost increase in manufacturing and testing.

Moreover, the front-end IC 1 of the present embodiment is so arranged that the driving circuits 65 and 66 are provided for use in outputting the output signal to the outside via the inspection-use output pins 61 and 62. Thus, it is possible to supply a measurement apparatus, which has a low input impedance, with such a signal that has a signal level high enough for the measurement apparatus to perform measurement highly accurately.

Moreover, the driving circuits 65 and 66 are provided in the front-end IC 1, whereby the driving circuits 65 and 66 can have a high relativity. Thus, it is possible to test the level difference and the phase difference of the I/Q signal accurately.

It should be noted that the present invention is not limited to the embodiments described above, and can be variously modified within the scope of the claims. The technical scope of the present invention includes embodiments realized by appropriately combining the technical means respectively disclosed in the different embodiments.

As described above, the integrated circuit of the present invention is so arranged that the switching control signal is supplied from outside.

According to the above invention, it is unnecessary to additionally provide a circuit for inspection in the integrated circuit, thereby avoiding the scale-up of the integrated circuit. Thus, it is possible to attain a short test time while preventing cost increase. Especially, the present invention is effective in a case where there is a large restriction with respect to a chip area.

Moreover, the integrated circuit of the present invention, which is an integrated circuit as described above, is so arranged as to include switching control signal generating means for outputting the switching control signal.

According to the above invention, the switching control signal for switching over the switching means is outputted from the switching control signal generating means.

Therefore, it is unnecessary to additionally provide the inspection-use pin for external connection. Thus, it is possible to perform the test in a short time while preventing increase in the manufacturing cost. Especially, the present invention is effective in a case where there is a large restriction in how many inspection-use pin can be provided.

Moreover, the integrated circuit of the present invention, which is an integrated circuit as described above, is so arranged that the fixed value signal is a test-use control voltage supplied from outside.

According to the above invention, it is possible to supply, as the fixed value signal, the test-use control voltage from outside and use the test-use control voltage as the amplification-rate control signal to be inputted into the variable gain amplifier in the RF circuit.

With this arrangement in which the test-use control voltage is supplied from outside, it is unnecessary to additionally provide the integrated circuit with a circuit for inspection, thereby avoiding scale-up of the integrated circuit. Therefore, it is possible to perform the test in a short time, while preventing an increase in the manufacturing cost. The present invention is especially effective in a case where there is a large restriction in the chip area.

Furthermore, the integrated circuit of the present invention, which is an integrated circuit as described above, is so arranged as to include test-use fixed value signal generating means for outputting the fixed value signal.

In the above invention, the fixed value signal to be directly supplied is generated by the test-use fixed value signal generating means provided in the integrated circuit.

With this arrangement, it is unnecessary to additionally provide an inspection-use pin for external connection. Thus, it is possible to perform the test in a short time while preventing an increase in manufacturing cost. The present invention is especially effective in a case where there is a large restriction in how many inspection-use pin can be provided.

Moreover, the integrated circuit of the present invention, which is an integrated circuit as described above, is so arranged that the digital demodulating circuit includes, in the automatic gain control loop, an amplification rate control circuit having an amplification rate control signal generating apparatus for generating an amplification rate control signal that is to be supplied to the variable gain amplifier in the RF circuit, and the switching means located preceding to the amplification rate control signal generating apparatus.

Therefore, the control signal from the amplification rate control circuit of the digital demodulating circuit can be used as the amplification rate control signal to be directly inputted into the variable gain amplifier by opening the AGC loop.

Therefore, the present invention is especially effective in a front-end integrated circuit in which the RF circuit and the digital demodulating circuit are integrated in one chip.

Moreover, the integrated circuit of the present invention, which is an integrated circuit as described above, is so arranged that the amplification rate control circuit has test-use amplification rate control signal generating means for outputting a test-use amplification rate control signal to the amplification rate control signal generating apparatus via the switching means, the test-use amplification rate control signal corresponding to the fixed value signal.

Therefore, it is unnecessary to additionally provide an inspection-use pin for external connection. Thus, it is possible to perform the test in a short time while preventing an increase in the manufacturing cost. The present invention is especially effective in a case where there is a large restriction in how many inspection-use pin can be provided.

Moreover, the integrated circuit of the present invention, which is an integrated circuit as described above, is so arranged as to a switching circuit for switching between, in accordance with an output draw-out switching control signal, (a) inputting a base band analog output to the digital demodulating circuit, and (b) outputting the base band analog output to outside via an inspection-use output terminal, the base band analog output being outputted from the RF circuit.

In the above invention, the switch circuit is controlled in accordance with the output draw-out switching control signal, thereby switching between (a) inputting a base band analog output to the digital demodulating circuit, and (b) outputting the base band analog output to outside via an inspection-use output terminal, the base band analog output being outputted from the RF circuit.

With this arrangement, it is possible to directly draw out the output the RF circuit. Thus, it is possible to test the RF circuit without providing the digital demodulating circuit with means for testing the RF circuit.

Therefore, it is possible to accurately test the RF circuit in a short time, without scaling up the integrated circuit. Thus, it is possible to prevent a cost increase in production and testing.

Furthermore, the integrated circuit of the present invention, which is an integrated circuit as described above, is so arranged as to include a driving circuit between the switching circuit and the inspection-use output terminal.

Therefore, because the driving circuit is provided for driving the output signal that is to be drawn out to the outside of the integrated circuit via the inspection-use pin, it is possible to supply a measurement apparatus, which has a low input impedance, with such a signal that has a signal level high enough for the measurement apparatus to perform measurement highly accurately.

Further, the present invention is so arranged that the driving circuit is provided in the integrated circuit, whereby the driving circuits can have a high relativity. Thus, it is possible to test the level difference and the phase difference of the I/Q signal accurately.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit of a front-end type for receiving a high frequency signal, comprising:
   an RF circuit including a variable gain amplifier;
   a digital demodulating circuit including an amplification rate control circuit;
   switching means for switching between (a) inputting an internal signal, as an amplification rate control signal, into the variable gain amplifier via an automatic gain control loop, the internal signal being outputted from the digital demodulating circuit and (b) directly inputting fixed value signals, as additional amplification rate control signals, into the variable gain amplifier by opening the automatic gain control loop; and a switching circuit for switching between, in accordance with an output draw-out switching control signal, (a) inputting a base band analog output to the digital demodulating circuit, and (b) outputting the base band analog output to outside via an inspection-use output terminal, the base band analog output being outputted from the RF circuit, wherein the RF circuit and the digital demodulating circuit are integrated in one package, and the switching means are switched over in accordance with a switching control signal.

2. The integrated circuit as set forth in claim 1, wherein:

the switching control signal is supplied from outside the integrated circuit.

3. The integrated circuit as set forth in claim 1, further comprising:

switching control signal generating means for outputting the switching control signal.

4. The integrated circuit as set forth in claim 1, comprising:

a driving circuit between the switching circuit and the inspection-use output terminal.

* * * * *